(12) United States Patent
Seidl et al.

(10) Patent No.: US 12,054,108 B2
(45) Date of Patent: Aug. 6, 2024

(54) ROOF CONSOLE FOR A VEHICLE

(71) Applicant: Volkswagen Aktiengesellschaft, Wolfsburg (DE)

(72) Inventors: Nicolas Seidl, Braunschweig (DE); Marcel Rosilius, Wolfsburg (DE)

(73) Assignee: Volkswagen Aktiengesellschaft, Wolfsburg (DE)

( * ) Notice: Subject to any disclaimer, the term of this patent is extended or adjusted under 35 U.S.C. 154(b) by 525 days.

(21) Appl. No.: 17/312,352

(22) PCT Filed: Nov. 29, 2019

(86) PCT No.: PCT/EP2019/083033
§ 371 (c)(1),
(2) Date: Jun. 9, 2021

(87) PCT Pub. No.: WO2020/120167
PCT Pub. Date: Jun. 18, 2020

(65) Prior Publication Data
US 2022/0017023 A1    Jan. 20, 2022

(30) Foreign Application Priority Data
Dec. 13, 2018 (DE) .......................... 102018221710.6

(51) Int. Cl.
*B60R 16/023* (2006.01)
(52) U.S. Cl.
CPC .................. *B60R 16/023* (2013.01)
(58) Field of Classification Search
CPC ........ B60J 7/043; B60N 2/0224; B60R 1/062; B60R 7/04; B60R 16/023; B60R 2011/0007; B60R 2011/0028; G06F 3/044
(Continued)

(56) References Cited

U.S. PATENT DOCUMENTS 8,718,797 B1    5/2014    Addepalli et al.
8,796,575 B2    8/2014    Salter et al.
(Continued)

FOREIGN PATENT DOCUMENTS

DE    102009042244 A1    3/2011
DE    102013002036 A1    8/2013
(Continued)

OTHER PUBLICATIONS

PCT/EP2019/083033. International Search Report. (Feb. 10, 2020).
Corresponding Chinese Patent Application No. 201980081246.7. Office Action (Dec. 23, 2023).

*Primary Examiner* — Jason S Daniels
(74) *Attorney, Agent, or Firm* — Peter Zura; LOZA & LOZA, LLP

(57) ABSTRACT

Roof console for a vehicle including at least one touch-slide operating element for operating vehicle functions. A surface of at least one touch-slide operating element is recessed or raised in relation to the surrounding surface. The base area of the recess or raised portion may correspond to the touch-sensitive input region of the touch-slide operating element. Two touch-slide operating elements, of the same length, may be provided directly adjacent to one another in respective recesses or on respective raised portions, separated by a demarcation. The demarcation may be formed as a rib, between two touch-slide operating elements situated in a recess, and as a gap, between touch-slide operating elements situated on a raised portion.

20 Claims, 4 Drawing Sheets

(58) Field of Classification Search
USPC .......................................... 296/24.34, 24.46
See application file for complete search history.

(56) References Cited

U.S. PATENT DOCUMENTS

| | | |
|---|---|---|
| 10,604,098 B1 * | 3/2020 | Perez Lecuona ........ B60N 3/10 |
| 10,732,831 B2 * | 8/2020 | Rosilius .............. G06F 3/04817 |
| 10,884,614 B1 * | 1/2021 | Austria ............... G06F 3/04883 |
| 10,915,199 B2 * | 2/2021 | Seok .................... B60K 37/06 |
| 2004/0227625 A1 | 11/2004 | Joehl et al. |
| 2013/0204457 A1 | 8/2013 | King et al. |
| 2015/0353005 A1 * | 12/2015 | Hodgson ................. G06F 3/016 |
| | | 362/546 |
| 2016/0112044 A1 * | 4/2016 | Salter ................... H03K 17/955 |
| | | 307/116 |
| 2017/0253121 A1 | 9/2017 | Kwon et al. |
| 2018/0334018 A1 | 11/2018 | Polak |

FOREIGN PATENT DOCUMENTS

| | | |
|---|---|---|
| DE | 102014008432 A1 | 12/2015 |
| DE | 102017104403 A1 | 9/2017 |
| DE | 102017221212 A1 * | 5/2019 |
| WO | 2014110317 A2 | 7/2014 |
| WO | 2019114981 A1 | 6/2019 |

* cited by examiner

ROOF CONSOLE FOR A VEHICLE

CROSS REFERENCE TO RELATED APPLICATION

The present application claims priority to International Patent Application no. PCT/EP2019/083033, to Nicolas Seidl et al., titled "Roof Console for a Vehicle", filed Nov. 29, 2019, which claims priority to German Patent Application no. 10 2018 221 710.6, filed Dec. 13, 2018, the contents of each being incorporated by reference in their entirety herein.

TECHNICAL FIELD

The present disclosure relates to a roof console for a vehicle.

BACKGROUND

In many vehicles, in particular passenger automobiles, there are roof consoles in which the operating elements for a sliding and/or tilting sunroof, or for a sun visor for the sliding/tilting sunroof, and for the interior lighting and other vehicle functions, are frequently integrated. The roof consoles are generally located toward the front, in the middle of the vehicle, between the sliding/tilting sunroof and the windshield. The operating elements for the sliding/tilting sunroof are usually mechanical multidirectional switches located in the roof console, with which the various roof functions can be activated and deactivated.

One disadvantage with these roof consoles are the expensive mechanical multidirectional switches, which tend to break down. Furthermore, it is difficult to automatically and manually cover the opening or closing procedures of all of the opening functions (such as sliding and tilting functions) with the multidirectional switch. Furthermore, roof consoles according to the prior art are not sufficiently suited for blind operation in that it is difficult to locate the multidirectional switch without looking.

SUMMARY

An aspect of the present disclosure illustrates a roof console that can be produced inexpensively and easily installed, and which can be easily operated, in some cases without looking.

A roof console for a vehicle may include at least one touch-slide operating element for operating vehicle functions. In some examples, the surface of at least one touch-slide operating element may be raised or recessed in relation to the surrounding surface. In other words, the touch-sensitive surface of the touch-slide operating element lies in a recess, also referred to as a depression, or on a raised area, also referred to as a rib. The base surface of the recess or raised area is preferably rectangular, corresponding to the touch-sensitive input region of the touch-slide operating element. The touch-slide operating elements may be advantageously suited for blind operation, such that the hand may merely locate the recess or raised area, and the operation thereof can then readily take place without looking. Furthermore, operating errors can be substantially eliminated, because coincidental, unintentional contact is prevented by the recess or raised area formed in configurations disclosed below.

The various examples specified in this application can be advantageously combined with one another, if not otherwise specified.

BRIEF DESCRIPTION OF THE DRAWINGS

The present disclosure shall be explained below in reference to exemplary embodiments, based on the drawings. Therein.

DETAILED DESCRIPTION

Figure 1:
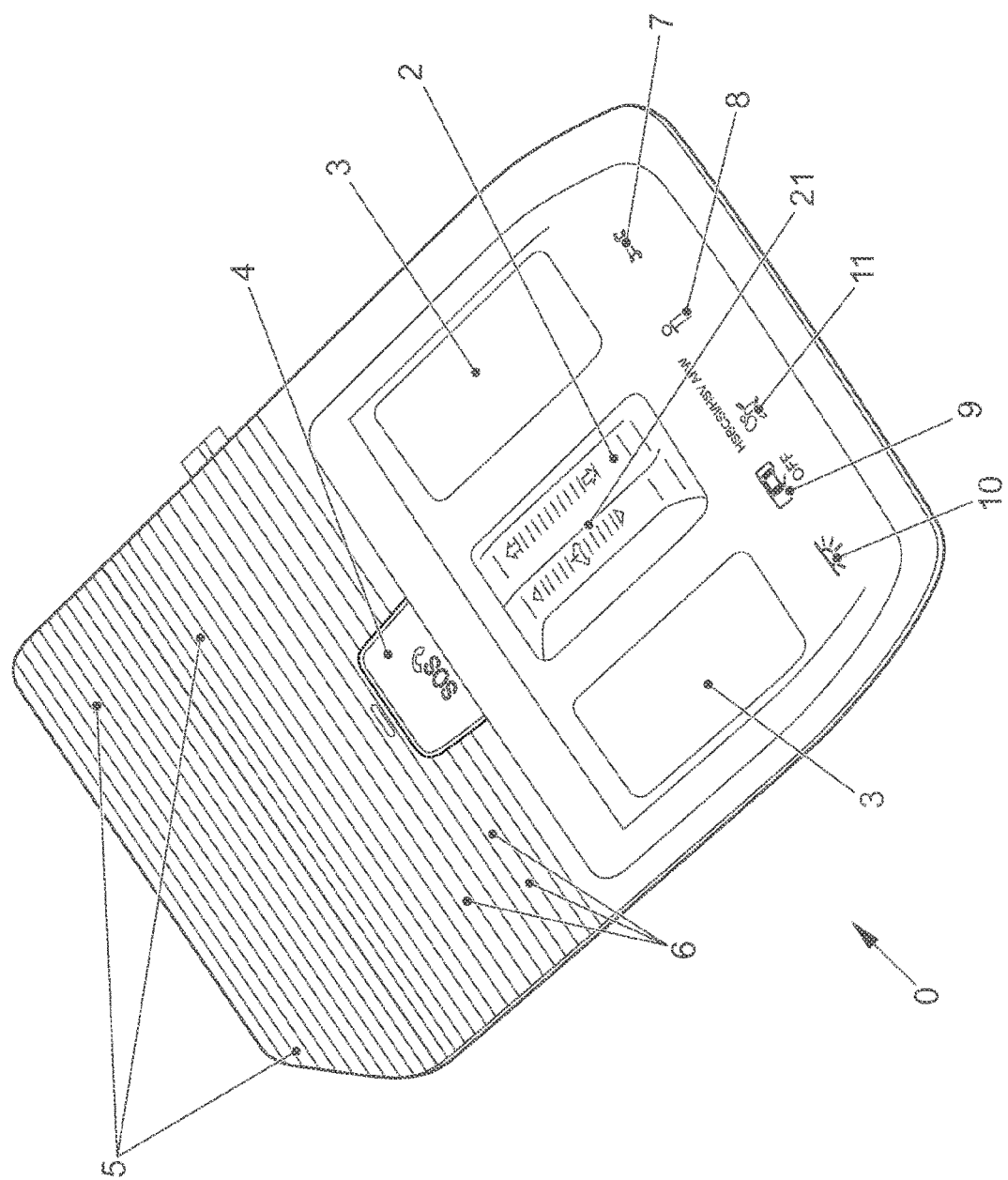
FIG. 1 shows a roof console according to some aspects of the present disclosure.

A touch-slide operating element as disclosed herein may be configured as a touch-sensitive operating element extending along a single dimension. Touch-slide operating elements can advantageously detect gestures in the form of tapping and wiping through the one-dimensional extension, such that numerous gestures and commands can be implemented. The wiping movements can also be detected in both directions of the one-dimensional extension. The sensors in the touch-sensitive operating element are preferably capacitive sensors, because these are inexpensive and responsive. Other systems can also be used, such as optical or resistive sensors.

In some examples, a recess for the touch-slide operating element may become narrower toward the bottom (the width of the recess decreases). If the touch-slide operating element is on a raised area, this raised area may taper upward (the width decreases toward the top). In other words, a cross section of the raised area or recess may be trapezoidal, wherein the touch-slide element is located on the shorter of the two parallel sides thereof. This advantageously simplifies finding the touch-sensitive input region of the touch-slide operating element.

In some examples, the raised area or recess may be configured to be 50% to 90% of the starting width where the touch-slide operating element is located, or 60% to 80% of the starting width (the starting width is the width of the raised area or recess at the level of the surrounding surface). As a result, the raised area can have a narrower width for the touch-slide operating element, and in the case of a recess, it is important that a finger fits within the recess.

In some examples, two touch-slide operating elements, which may be configured having the same length, are located directly adjacently to one another in a recess or on a raised area, separated by a barrier. If the barrier is in a recess between two touch-slide operating elements it is preferably in the form of a web, and if the touch-slide operating elements are on a raised area, it is preferably formed by a slot. This is particularly suitable for interconnected vehicle functions. In some examples, the barrier may be configured to have 20% to 80% of the overall height or depth, more preferably 30% to 70% thereof, and particularly preferably 40% to 60% of the overall height/depth (specifically, this relates to the height of the web forming a barrier in the case of a recess, and the depth of the slot forming a barrier in the case of a raised area, in relation to the overall height/depth).

In some examples, all of the edges of the recesses or raised areas may be rounded. This may make the tactile impression more pleasant.

In some examples, a touch-slide operating element for controlling a sliding sunroof and a touch-slide operating element for controlling the sun visor for the sliding sunroof, may be configured to be adjacent to one another. The user can thus advantageously operate both vehicle functions, such as opening the sliding sunroof and the sun visor, with a gesture using two fingers on the same hand.

In some examples, numerous vehicle functions can also be operated by means of a touch-slide operating element. By way of example, a touch-slide operating element can be configured such that a sliding sunroof and the sun visor can be opened simultaneously by a wiping gesture. This may further simplify operation.

In some examples, the height of the barrier may be configured to be between that of the raised area or recess and that of the surrounding surface. This design may be advantageous from a tactile perspective, because the barrier is easy to find, and represents a good reference point from which it is easy to operate the two adjacent touch-slide operating elements without looking.

In other examples, the raised area or recess may be configured to be 1 cm to 4 cm wide in the region of the touch-slide operating element, and preferably 1.8 cm to 3 cm. An average finger may advantageously fit within a recess, or on the touch-slide region of a raised area, that has a width in this range. In the case of a wiping movement in recess, the finger may be guided along the touch-sensitive region of the touch-slide operating element at this width. This facilitates a blind operation thereof.

In some examples, the recess/raised area may be configured to have a height of 30% to 140% of the width in the region of the touch-slide operating element, more preferably between 50% and 120% and particularly preferably between 60% and 100%. The tactile impression may be particularly pleasant to a user with a ratio of the depth (height) to the width in this range, and facilitates blind operation thereof.

In some examples, the length of the raised area or recess for the touch-slide operating element at the level of the touch-slide operating element may be configured to be 3 cm to 10 cm, more preferably 3.5 cm to 7 cm, and particularly preferably between 4 cm and 6 cm. The length of the recess/raised area may be configured to decrease as it becomes higher/deeper. The length of the recess/raised area at the level of the surrounding surface may be configured to be 110% to 200% of the starting width, more preferably in a range of 130% to 180%, and particularly preferably between 140% and 160% thereof. The touch-slide elements may be configured to be oriented in the direction of travel in the roof console. This means that the one-dimensional extension of the touch-sensitive input region of the touch-slide operating element extends from the windshield toward the rear window. This orientation is advantageously well adapted to the operating logic for a sliding sunroof or sun visor.

The at least one touch-slide operating element in the roof console according to the present disclosure may be configured to be operable for the following exemplary vehicle functions: a sliding and/or tilting sunroof, a sun blind or other type of sun visor for a sliding/tilting sunroof that can be opened, functional glass, such as electrochromic glass, that enables a dimming and can be used for sun protection, a convertible canopy top, a motorized hatchback, a window lift, or interior lighting for the vehicle. Buttons (also preferably designed as touch-sensitive operating elements) can surround the touch-slide operating element that enable operation of numerous vehicle functions with the touch-slide operating element, with which the user selects the vehicle functions that are to be controlled with the touch-slide operating element. In some examples, the selection buttons may be configured in the immediate vicinity of the touch-slide operating element, to enable operation thereof with just one hand. In this manner, a simple and clear operation of numerous vehicle functions can be advantageously obtained in this manner.

In some examples, a sliding/tilting sunroof is a roof that can be opened in that a portion of the roof is slid over, into, or beneath a neighboring portion of the roof. Numerous sliding sunroofs can also be tilted, in that the rear portion of the roof, seen in the direction of travel, is raised, thus enabling ventilation while still providing protection against rainfall. Aspects of the present disclosure may be used with sunroofs that only slide, sunroofs that only tilt, and sunroofs that both slide and tilt.

In some examples, the roof console may be configured with a control unit that recognizes the input gestures and converts them to control signals for the end device (sliding/tilting sunroof, sun blind, etc.).

In some examples, the roof console may be configured such that a wiping movement over a defined length l1 triggers an automated full opening or closing of the sunroof or the sun blind. A wiping movement in the opening direction of the sunroof particularly preferably causes an opening of the sunroof, and a wiping movement in the closing direction causes the sunroof to close. The defined length l1 may be selected such that the finger slides over a substantial portion of the touch-screen operating element, without the user having to ensure that the finger passes over the entire length. In some examples, the length may be configured between 50% and 90% of the overall length of the touch-slide operating element, and preferably between 60% and 80%. As a result, the user can advantageously fully open or close the sunroof with a simple, quick gesture, that can be executed without looking.

In some examples, the user can also stop the automated opening or closing of the sunroof by tapping on the touch-slide operating element. The sensitivity of the touch-slide element is preferably set such that operating errors caused by a finger coming close to it can be minimized, e.g., when blindly searching for another operating element in the roof console. As a result, the user can advantageously open the sunroof or sun visor to a desired setting with a gesture requiring very little attention.

In some examples, the roof console may be configured such that a wiping movement over a defined length l2 and the subsequent lingering of the finger after the wiping movement, where the wiping movement has come to an end, triggers an opening or closing movement, which lasts until the finger is removed. The defined length l2 may be selected analogously to the length l1, enabling a simple operation requiring little attention, which can be carried out without looking while still minimizing operating errors. In some examples, the length l2 may be configured between 50% and 90% of the overall length of the touch-slide operating element, preferably between 60% and 80%. This may advantageously result in another possibility for operating the sunroof or sun visor, such that the operation is more intuitive.

In another example, the touch-slide operating element may be configured in the roof console such that a tapping at an arbitrary point on the touch-slide operating element causes the sunroof to tilt open or close. Furthermore, the opening or closing can preferably be stopped by further tapping, such that the sunroof can be tilted to a specific extent. Here as well, the gesture is simple, quick, and can be executed without looking, thus minimizing distraction to the driver.

In another example of the roof console, the touch-slide operating element for controlling a sliding sunroof or sun blind may be configured such that a tapping on the boundary area of the touch-slide operating element causes a movement in the direction indicated by the boundary area. The movement of the sunroof or sun blind preferably continues as long as the finger is in contact with the touch-slide operating element.

In an alternative embodiment, an automatic movement can be initiated by a short tapping at the boundary area. In this case, the operation of the tilting function described above is then limited to the middle section of the touch-slide operating element.

In some examples, the boundary areas may be selected such that it is not necessary for the user to be particularly precise in searching for a specific position, but there is still a clear boundary to the middle section. The front and rear boundary areas may be configured to be 5% to 20% of the overall length of the touch-slide operating element, preferably between 10% and 15% thereof. This advantageously results in further operating possibilities.

In some examples, the roof console may include two directly adjacent touch-slide operating elements, which can be configured to be the same size. By placing them directly adjacent to one another, it is advantageously possible to operate both touch-slide operating elements at the same time with two fingers of the same hand. The touch-slide operating elements for a sliding sunroof and a sun visor for the sliding sunroof are particularly preferably positioned adjacently to one another, such that the sliding sunroof and the sun visor can be advantageously operated simultaneously.

In another example, the middle of the touch-slide operating element can be felt tactically by the user, e.g., by giving the surface a special structure. The entire surface of the touch-slide operating element may be configured to be offset to surrounding surface in a tactile manner, e.g., by a ribbing transverse to the direction of extension of the touch-slide operating element. In some examples, the spacing between the transverse ribbing increases toward the boundary area of the touch-slide operating element. This design significantly simplifies operation thereof without looking, because not only locating the touch-slide operating element, but also locating a position thereon, is simplified.

The roof console may be configured to include a light that can be dimmed. This is preferably an interior lighting in the middle, and/or a light that can be directed toward the front seats, specifically for reading. The lighting is particularly preferably obtained with LEDs, as these are advantageously inexpensive and energy-saving. In some examples, the lighting can be dimmed.

The light emission surface itself may be configured to form a touch-sensitive operating element with which the lighting can be dimmed. In some examples, an adjacent region can also form a touch-sensitive operating element. Operation preferably takes place by means of tapping, e.g., placing a finger on the touch-sensitive operating element and subsequently removing it to switch it on and off. When a finger taps and remains on the operating element, also referred to as a "long press," the lighting is slowly dimmed, after a short delay, until the user's finger is removed from the touch-sensitive operating element. Alternatively, tapping and remaining can also increase the illumination level, until the user's finger is removed from the touch-sensitive operating element. Combining all of the lighting functions in one operating element advantageously results in a simple and intuitive operation without looking, in particular when the light emission surface is also the operating element, because it is more difficult to visually locate operating elements next to light emission surfaces when the light is on.

In some examples, the lighting in the rear of vehicle interior may also be controlled via the operating element in the roof console, preferably such that it can likewise be dimmed via a touch-sensitive operating element, as described above. As a result, all of the interior lighting in the vehicle can advantageously be controlled from the front seats.

A hazard warning signal button, a button for requesting information or roadside service, a button for door contact options (i.e. selecting whether the lighting should be activated automatically when a door is opened), a button for opening or closing the hatchback or trunk, a button for opening and closing a convertible canopy, or a button for the entire interior lighting can also be configured as touch-sensitive operating elements under some examples. The hazard warning signal button may be configured to be located underneath a safety flap, in order to advantageously prevent unintentional activation. Function feedback can be obtained via the backlighting of a symbol located in the touch-sensitive operating element, e.g., via a color change. The backlighting for the touch-sensitive operating element can be obtained in a space-saving manner with an optical fiber.

The touch-sensitive operating elements in the roof console can configured to be felt in a tactile manner by the user, such that the user can locate and operate the touch-sensitive input regions without looking. For this, the touch-sensitive input regions of a touch-sensitive operating element have a surface that feels different from its surrounding surface, e.g., entirely or partially textured, entirely or partially coated, or otherwise structured. The surface of the touch-sensitive input region can also be offset with respect to its surroundings, e.g., raised or recessed, or it may have a frame that at least partially encompasses it. This advantageously facilitates blind operation thereof, because it is possible to find the touch-sensitive input region without looking, simply by feel.

The roof console may include a digital microphone, which can be used, e.g., for a hands-free function in the vehicle, or for voice control. Voice signals from the driver or passenger positions can be advantageously registered by positioning the microphone in the roof console, with limited interference from ambient noise.

In some examples, other vehicle function indicators can be provided in the roof console. These may be configured as backlit symbols. The backlight can be switched on or off, or its color changed, to indicate the vehicle function. Examples of these vehicle functions are a "Passenger Airbag Off" indicator or a door contact indicator, e.g., information regarding vehicle doors that are still open. These indicators in the roof console may be placed such that they can advantageously be seen readily by all vehicle occupants.

The roof console may also be configured to include a sensor system for monitoring the interior of the vehicle, which can be used, e.g., for alarm systems. The interior, in particular the rear region, can advantageously be monitored particularly well from the position of the roof console.

In another example, the roof console is connected electrically to the vehicle via just one multi-contact plug-in connector. This advantageously reduces installation efforts.

FIG. 1 shows a roof console 0 according to some aspects of the present disclosure, that is configured for installation in a vehicle roof. In this example, the roof console 0 may be configured with a touch-slide operating element 1 for opening the sunroof on a vehicle. A further touch-slide operating element 2 for a sun visor may be configured to open the sun visor in the sunroof. Both touch-slide operating elements 1, 2 may be placed in recesses that are separated by a barrier 21 in the form of a web. The recesses may be configured to have the same size. By positioning the two touch-slide operating elements 1 (for the sunroof) and 2 (for the sun visor) directly adjacent to one another, the user can operate both touch-slide operating elements 1, 2 simultaneously, with two fingers, e.g., the index finger and the middle finger.

The roof console 0 also may be configured with two light emission surfaces 3, aimed at the front seats. The light emission surfaces 3 may also be configured as touch-sensitive operating elements. The light may be switched on and off by tapping on the touch-sensitive operating elements, e.g., the light emission surfaces. With a long press, e.g., when the finger is placed and held against the light emission surface 3, the light is slowly dimmed after a short delay, if the light is on, and if the light is off, it slowly brightens, until the finger is removed from the light emission surface 3.

The roof console 0 may also be configured with a hazard warning signal button 4, located beneath a safety flap, which may be opened to activate the button.

Openings 5 for the sensor system may be located behind them for monitoring the interior are located on the side of the roof console 0 facing away from the windshield. In this example, there are adjacent openings 6 for a digital microphone on the side facing the driver. The openings 5 and 6 may be formed in matte black plastic with a ribbed surface.

The roof console 0 may be configured with a touch-sensitive operating element 7 for calling roadside service and a touch-sensitive operating element 8 for requesting information, a touch-sensitive operating element 9 for door contact options, and a touch-sensitive operating element 10 for the interior lighting. The touch-sensitive operating elements 7-10 are indicated by a backlit symbol, wherein an activation results in a change in the color of the symbol. There is also a "Passenger Airbag Off" indicator 11. The touch-sensitive operating elements 7 and 8, for calling for roadside service and requesting information, door contact options 9, and the interior lighting 10, as well as the "Passenger Airbag Off" indicator 11 are adjacent to one another on the side of the roof console 0 facing the windshield, and have a high-gloss surface, produced through "In Mold Labeling."

Figure 2:
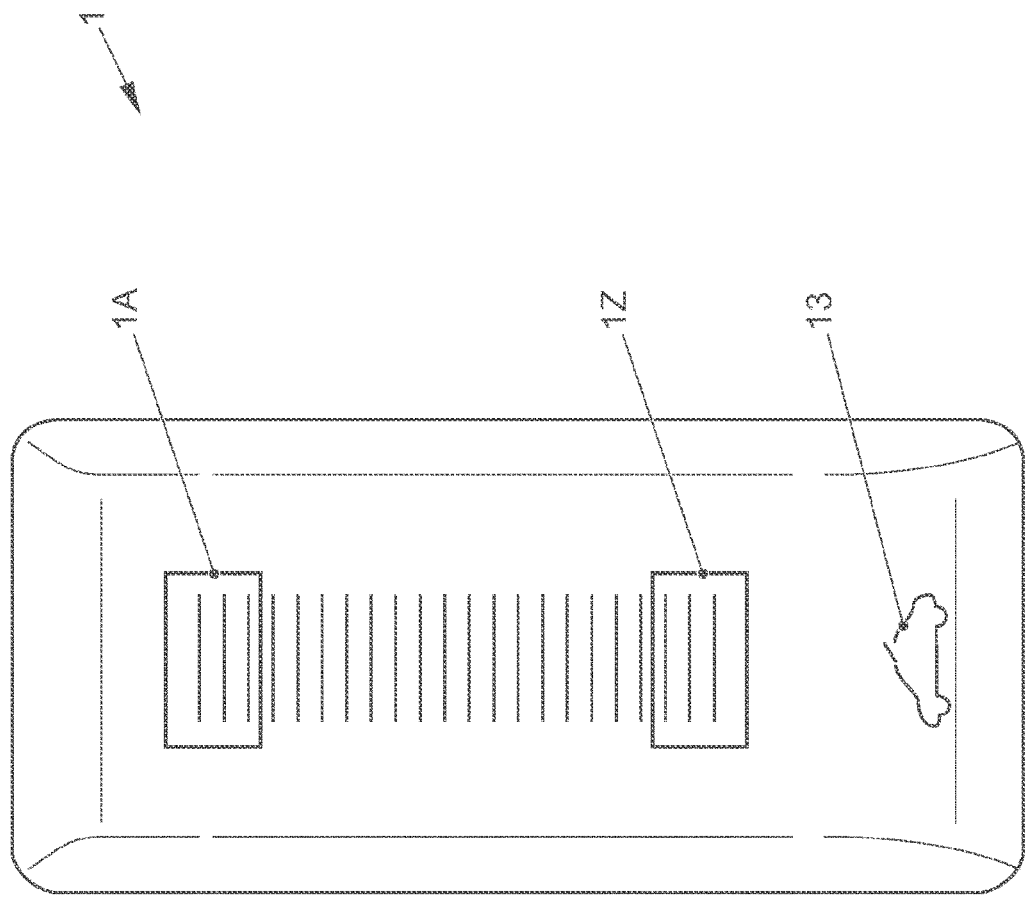
FIG. 2 shows an enlarged illustration of a touch-slide operating element according to some aspects of the present disclosure.

FIG. 2 shows an enlarged view of the touch-slide operating element 1 for the sunroof. In this example, the touch-slide operating element 1 may be configured with boundary areas 1A, 1Z and an adjacent vehicle symbol 13. In the installed state, the vehicle symbol 13 faces toward the windshield. For clarification, it should be noted that the frame surrounding the boundary areas 1A, 1Z in the figure is only visible for illustrative purposes.

The operating logic of the touch-slide operating element 1 for the sunroof may be configured as follows under some examples:

1. A single tapping on the boundary area 1A, 1Z automatically results in fully opening or closing the sunroof with the sliding function. Tapping the boundary area 1Z, e.g., the side of the touch-slide operating element 1 facing the windshield, fully closes the sliding sunroof, and tapping the boundary area 1A fully opens the sliding sunroof.
2. Tapping and remaining (long press) on the boundary area 1A, 1Z opens or closes the sunroof, analogously to point 1, but stops when the finger is removed from the boundary area 1A, 1Z of the touch-slide operating element 1.
3. Tapping while the sunroof is automatically slid open or closed stops the sunroof at the current position.
4. If the sunroof is closed, tapping at an arbitrary position on the touch-slide operating element 1 for the sunroof tilts the sunroof upward. A second tapping, when the sunroof is tilted open, closes the sunroof with the tilting function. Tapping while the sunroof is being tilted open or closed stops it at the current position.
5. A wiping movement toward the boundary area 1A fully slides the sunroof open. A wiping movement toward the boundary area 1Z fully closes the sunroof, in either the sliding function or the tilting function.
6. A wiping movement with a subsequent lingering of the finger opens or closes the sunroof with the sliding function, until the finger is removed from the touch-slide operating element 1 for the sunroof. A wiping movement toward the boundary area 1A also opens the sun roof, and toward the boundary area 1Z closes the sunroof.

The operating logic for the touch-slide operating element 2 for the sun visor (see FIG. 1) is analogous to the operating logic for the touch-slide operating element 1 for the sunroof described above. The operating functions for the tilting function under point 4 are not included, however. The operation for dimming a functional glass can also take place analogously.

Figure 3:
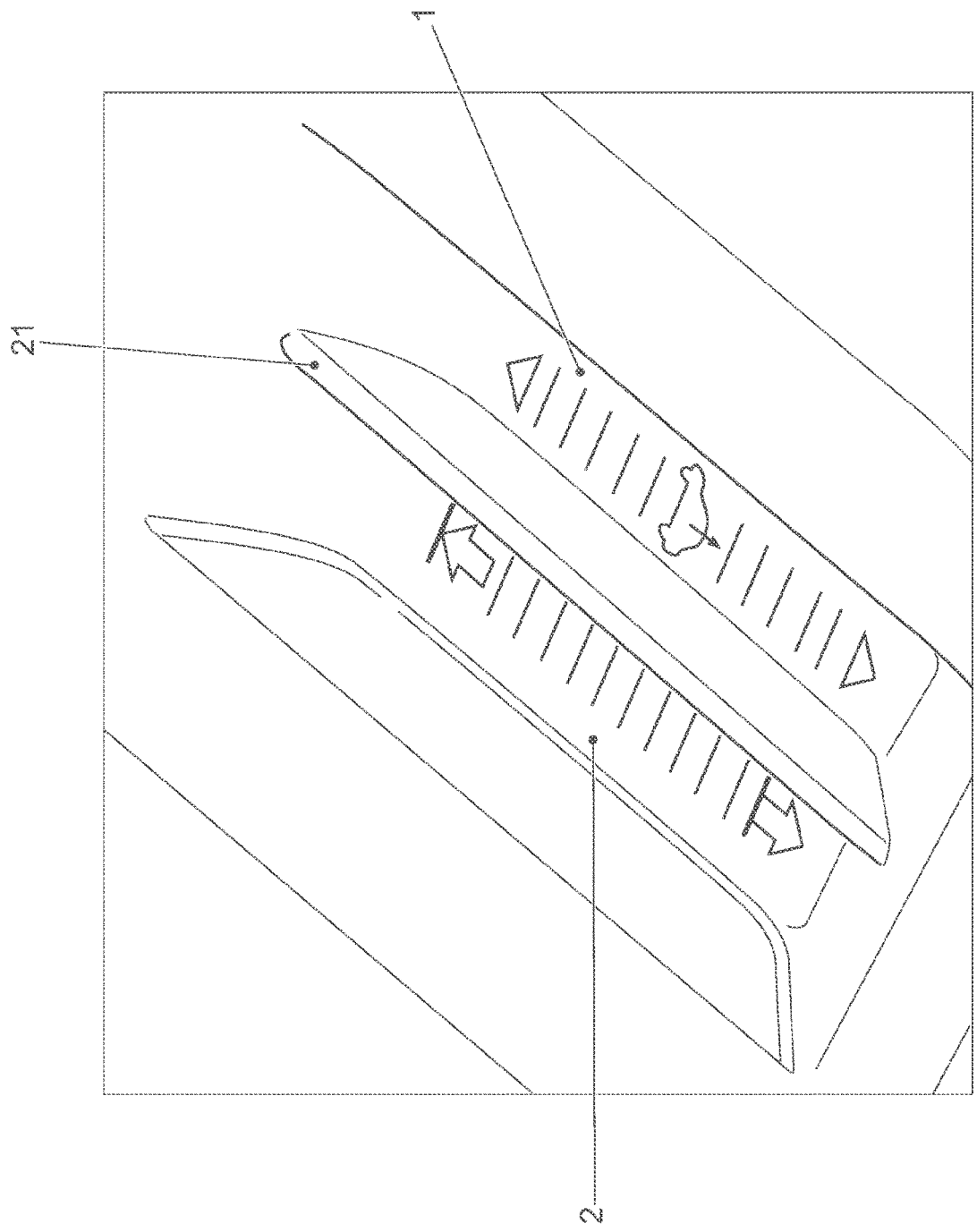
FIG. 3 shows two touch-slide operating elements located on a raised area according to some aspects of the present disclosure.

FIG. 3 shows an alternative embodiment of the roof console 0, in which the touch-slide operating elements 1, 2 are located on a raised area, and separated from one another by a barrier 21 in the form of a slot.

Figure 4:
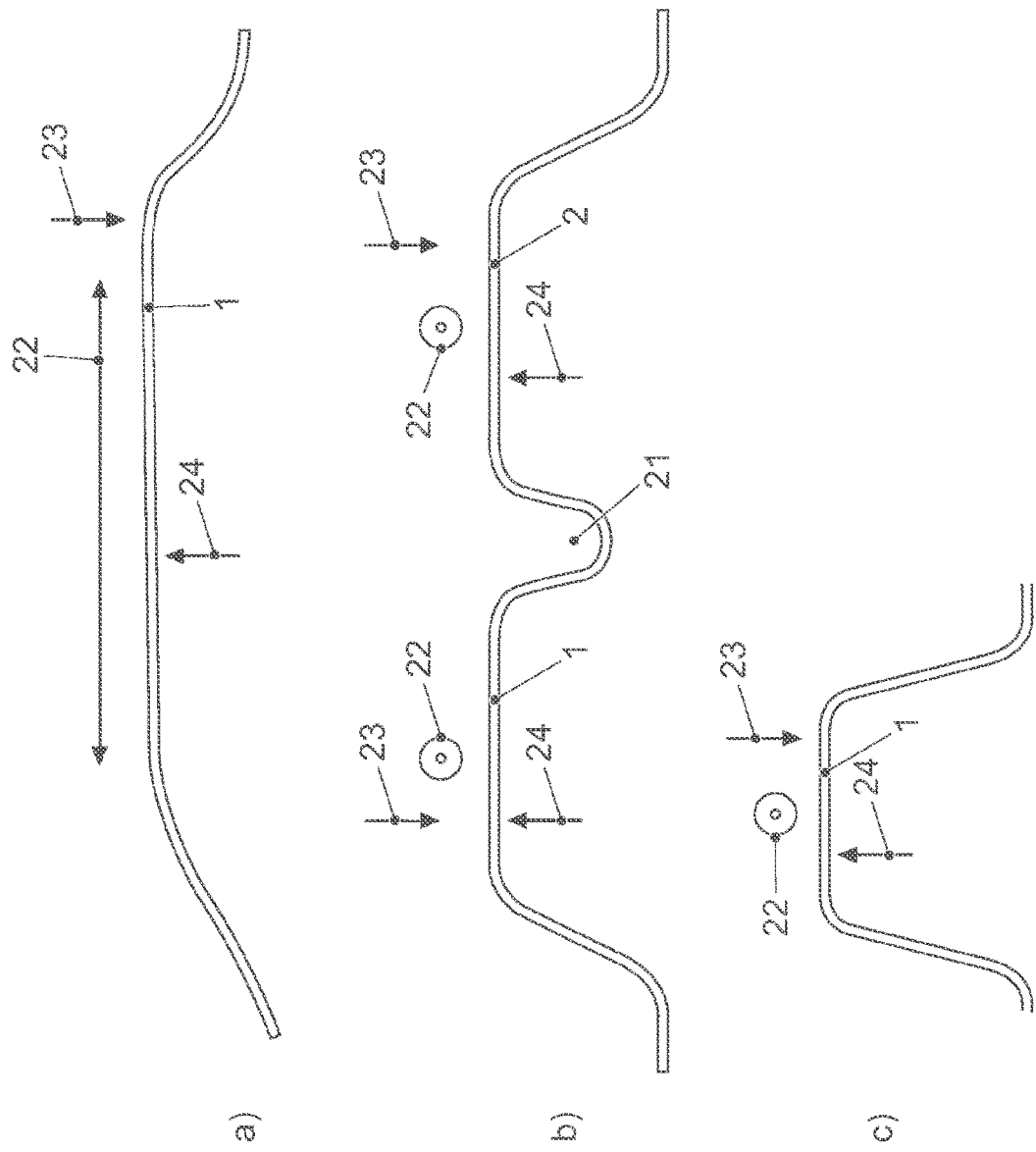
FIG. 4 shows numerous cross sections of the recess or raised area according to some aspects of the present disclosure.

FIG. 4 shows various cross sections of the recess or raised area in the touch-slide operating elements 1, 2. The operating direction 23 may be configured for when the operating element is viewed as a recess (i.e. the direction from which a finger approaches the touch-slide operating element 1, 2 for operation thereof), and the operating direction 24 is for when the operating element is formed on a raised area.

FIG. 4a) shows a cross section through a touch-slide operating element 1 in the direction of its extension 22. The direction of extension 22 indicates the direction of the one-dimensional extension of the touch-slide operating element 1, e.g., also the direction of the wiping gestures.

FIG. 4b) shows a cross section through two touch-slide operating elements 1, 2 in both a recess as well as on a raised area, transverse to the directions of extension thereof. The barrier 21 can be seen in the middle, which forms a web when seen as a recess, and forms a slot when seen as a raised area. The height of the web, or the depth of the slot, is approximately half the depth of the recess, or height of the raised area.

FIG. 4c) shows a cross section analogous to FIG. 4b), wherein a single touch-slide operating element 1 is located in a recess or on a raised area.

The trapezoidal cross section of the recess/raised area can be readily seen in the cross sections shown in FIG. 4, e.g., that the width and the length of the recess/raised area decrease as the depth/height increases.

LIST OF REFERENCE SYMBOLS 0 roof console
1 touch-slide operating element for the sunroof 2 touch-slide operating element for the sun visor
21 barrier
22 direction of extension of the touch-slide operating element
23 operating direction in the case of a raised area
24 operating direction in the case of a recess
3 light emission surface
4 hazard warning signal button
5 opening for the sensor system for interior monitoring
51 sensor system and control electronics for interior monitoring
6 openings for a microphone
7 touch-sensitive operating element for calling roadside service
8 touch-sensitive operating element for requesting information
9 touch-sensitive operating element for door contact options
10 touch-sensitive operating element for interior lighting
11 Passenger Airbag Off indicator
13 vehicle symbol
1A boundary area
1Z boundary area

The invention claimed is:

1. A roof console for a vehicle, comprising:
a surface on the roof console comprising a touch area configured on a raised portion relative to the surface; and
a touch-slide operating element configured in the touch area, wherein the touch-slide operating element comprises a boundary area surrounding the touch-slide operator control element, and wherein the touch-slide operating element is configured to receive a plurality of different touch inputs within the boundary area,
wherein the touch-slide operating element is configured to activate or deactivate different vehicle functions based on the different touch inputs received by the touch-slide operating element,
and wherein a surface of the touch-slide operating element is arranged on the raised portion in relation to a surface of the boundary area, wherein the raised portion tapers as the height increases.

2. The roof console of claim 1, wherein the raised portion is configured to form a substantially trapezoidal shape.

3. The roof console of claim 1, wherein the raised portion tapers to a width of 1.8 cm to 3 cm to receive the plurality of different touch inputs.

4. The roof console of claim 1, wherein the raised portion is configured between 50% and 120% in the region of the touch-slide operating element.

5. The roof console of claim 1, wherein the touch-slide operating element comprises a capacitive sensor.

6. The roof console of claim 1, wherein the vehicle functions comprise at least one of sliding and/or tilting a sunroof, sliding and/or tilting a sun visor for the sunroof, activating dimmable functional glass, activating a convertible canopy, activating a motorized hatchback, activating a window lift, or activating an interior lighting.

7. The roof console of claim 1, wherein the different touch inputs comprise a single tap, a long-press, and a wiping movement.

8. The roof console of claim 7, wherein the different touch inputs perform new vehicle functions if at least one of the different touch inputs is received during the operation of a vehicle function.

9. The roof console of claim 1, further comprising a second touch-slide operating element configured adjacent to the touch-slide operating element in the touch area, the second touch-slide operating element being separated from the touch-slide operating element by a demarcation, wherein the second touch-slide operating element comprises a second boundary area, and wherein the second touch-slide operating element is configured to receive a second plurality of different touch inputs within the second boundary area,
wherein the second touch-slide operating element is configured to activate or deactivate the different vehicle functions based on the different touch inputs received by the second touch-slide operating element.

10. The roof console of claim 9, wherein the demarcation comprises a gap.

11. A method for configuring a roof console for a vehicle, comprising:
providing a surface on the roof console comprising a touch area configured in a raised portion relative to the surface; and
providing a touch-slide operating element configured in the touch area, wherein the touch-slide operating element comprises a boundary area surrounding the touch-slide operator control element, and wherein the touch-slide operating element is configured to receive a plurality of different touch inputs within the boundary area,
wherein the touch-slide operating element is configured to activate or deactivate different vehicle functions based on the different touch inputs received by the touch-slide operating element,
and wherein a surface of the provided touch-slide operating element is arranged on the raised portion in relation to a surface of the boundary area, wherein the raised portion tapers as the height increases.

12. The method of claim 11, wherein providing the surface comprises providing the raised portion to be configured to form a substantially trapezoidal shape.

13. The method of claim 11, wherein providing the surface comprises providing the raised portion to have a width of 1.8 cm to 3 cm to receive the plurality of different touch inputs.

14. The method of claim 11, wherein providing the surface comprises providing the raised portion to be configured between 50% and 120% in the region of the touch-slide operating element.

15. The method of claim 11, wherein providing the touch-slide operating element comprises providing the touch-slide operating element comprising a capacitive sensor.

16. The method of claim 11, wherein the vehicle functions comprise at least one of sliding and/or tilting a sunroof, sliding and/or tilting a sun visor for the sunroof, activating dimmable functional glass, activating a convertible canopy, activating a motorized hatchback, activating a window lift, or activating an interior lighting.

17. The method of claim 11, wherein the different touch inputs comprise a single tap, a long-press, and a wiping movement.

18. The method of claim 17, wherein the different touch inputs perform new vehicle functions if at least one of the different touch inputs is received during the operation of a vehicle function.

19. The method of claim 11, further comprising
providing a second touch-slide operating element configured adjacent to the touch-slide operating element in the touch area, the second touch-slide operating element being separated from the touch-slide operating element by a demarcation, wherein the second touch-slide operating element comprises a second boundary area, and wherein the second touch-slide operating element is configured to receive a second plurality of different touch inputs within the second boundary area, wherein the second touch-slide operating element is configured to activate or deactivate the different vehicle functions based on the different touch inputs received by the second touch-slide operating element.

20. The method of claim 19, wherein the demarcation comprises a gap.

* * * * *